United States Patent
Wu et al.

(10) Patent No.: US 12,148,661 B2
(45) Date of Patent: Nov. 19, 2024

(54) METHOD OF FORMING INTEGRATED FAN-OUT PACKAGES WITH BUILT-IN HEAT SINK

(71) Applicant: Taiwan Semiconductor Manufacturing Co., Ltd., Hsinchu (TW)

(72) Inventors: Chih-Wei Wu, Zhuangwei Township (TW); Ying-Ching Shih, Hsinchu (TW); Szu-Wei Lu, Hsinchu (TW); Jing-Cheng Lin, Hsinchu (TW); Long Hua Lee, Taipei (TW)

(73) Assignee: TAIWAN SEMICONDUCTOR MANUFACTURING COMPANY, LTD, Hsinchu (TW)

( * ) Notice: Subject to any disclaimer, the term of this patent is extended or adjusted under 35 U.S.C. 154(b) by 272 days.

(21) Appl. No.: 17/676,627

(22) Filed: Feb. 21, 2022

(65) Prior Publication Data
US 2022/0199465 A1    Jun. 23, 2022

Related U.S. Application Data

(62) Division of application No. 16/570,046, filed on Sep. 13, 2019, now Pat. No. 11,257,715, which is a
(Continued)

(51) Int. Cl.
*H01L 21/768* (2006.01)
*H01L 21/56* (2006.01)
(Continued)

(52) U.S. Cl.
CPC ...... *H01L 21/76885* (2013.01); *H01L 21/568* (2013.01); *H01L 23/3114* (2013.01);
(Continued)

(58) Field of Classification Search
CPC ............... H01L 21/4846; H01L 21/568; H01L 21/6885; H01L 23/367; H01L 23/3114; H01L 23/5389; H01L 25/105; H01L 2224/12105; H01L 2224/48227; H01L 2224/32245; H01L 21/76885; H01L 23/29; H01L 23/31; H01L 23/3128;
(Continued)

(56) References Cited

U.S. PATENT DOCUMENTS 8,361,842 B2    1/2013   Yu et al.
8,680,647 B2    3/2014   Yu et al.
(Continued)

FOREIGN PATENT DOCUMENTS

CN    102646628 A    8/2012
CN    103681541 A    3/2014
(Continued)

*Primary Examiner* — Khiem D Nguyen
(74) *Attorney, Agent, or Firm* — Slater Matsil, LLP

(57) ABSTRACT

A method of forming a semiconductor device includes attaching a metal foil to a carrier, the metal foil being pre-made prior to attaching the metal foil; forming a conductive pillar on a first side of the metal foil distal the carrier; attaching a semiconductor die to the first side of the metal foil; forming a molding material around the semiconductor die and the conductive pillar; and forming a redistribution structure over the molding material.

20 Claims, 16 Drawing Sheets

Related U.S. Application Data division of application No. 15/967,046, filed on Apr. 30, 2018, now Pat. No. 10,510,595.

(51) Int. Cl.
  *H01L 23/00* (2006.01)
  *H01L 23/31* (2006.01)
  *H01L 23/367* (2006.01)

(52) U.S. Cl.
  CPC ............ *H01L 23/367* (2013.01); *H01L 24/11* (2013.01); *H01L 24/14* (2013.01); *H01L 24/81* (2013.01)

(58) Field of Classification Search
  CPC ..... H01L 23/49816; H01L 2224/32225; H01L 2224/49113; H01L 2224/29187; H01L 2224/73267; H01L 2224/48091
  See application file for complete search history.

(56) References Cited

U.S. PATENT DOCUMENTS

| | | |
|---|---|---|
| 8,703,542 B2 | 4/2014 | Lin et al. |
| 8,759,964 B2 | 6/2014 | Pu et al. |
| 8,778,738 B1 | 7/2014 | Lin et al. |
| 8,785,299 B2 | 7/2014 | Mao et al. |
| 8,803,306 B1 | 8/2014 | Yu et al. |
| 8,809,996 B2 | 8/2014 | Chen et al. |
| 8,829,676 B2 | 9/2014 | Yu et al. |
| 8,877,554 B2 | 11/2014 | Tsai et al. |
| 8,980,691 B2 | 3/2015 | Lin |
| 9,000,584 B2 | 4/2015 | Lin et al. |
| 9,035,461 B2 | 5/2015 | Hu et al. |
| 9,048,222 B2 | 6/2015 | Hung et al. |
| 9,048,233 B2 | 6/2015 | Wu et al. |
| 9,064,879 B2 | 6/2015 | Hung et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |
| 9,704,825 B2 * | 7/2017 | Wu ..................... H01L 23/5389 |
| 9,824,989 B2 * | 11/2017 | Shih ....................... H01L 24/82 |
| 10,354,988 B2 | 7/2019 | Jeng et al. |
| 10,510,690 B2 * | 12/2019 | Jeng .................. H01L 21/02118 |
| 2002/0179952 A1 * | 12/2002 | Nakata .................... H01L 28/75 257/306 |
| 2005/0056365 A1 | 3/2005 | Chan |
| 2007/0200133 A1 | 8/2007 | Hashimoto et al. |
| 2009/0096115 A1 | 4/2009 | Huang et al. |
| 2009/0283895 A1 | 11/2009 | Kikuchi et al. |
| 2011/0062578 A1 | 3/2011 | Katagiri et al. |
| 2011/0193217 A1 | 8/2011 | Meyer-Berg |
| 2011/0278705 A1 | 11/2011 | Oh et al. |
| 2011/0291249 A1 | 12/2011 | Chi et al. |
| 2011/0291288 A1 | 12/2011 | Wu et al. |
| 2013/0001776 A1 * | 1/2013 | Yu ........................... H01L 24/97 257/E23.021 |
| 2013/0026468 A1 | 1/2013 | Yoshimuta et al. |
| 2013/0062760 A1 | 3/2013 | Hung et al. |
| 2013/0062761 A1 | 3/2013 | Lin et al. |
| 2013/0168848 A1 | 7/2013 | Lin et al. |
| 2013/0307140 A1 | 11/2013 | Huang et al. |
| 2014/0077394 A1 * | 3/2014 | Chang ................. H01L 23/4334 257/782 |
| 2014/0203429 A1 | 7/2014 | Yu et al. |
| 2014/0210099 A1 * | 7/2014 | Hu ........................ H01L 23/481 257/774 |
| 2014/0225222 A1 | 8/2014 | Yu et al. |
| 2014/0252646 A1 | 9/2014 | Hung et al. |
| 2014/0264930 A1 | 9/2014 | Yu et al. |
| 2015/0001708 A1 | 1/2015 | Lin |
| 2015/0069623 A1 | 3/2015 | Tsai et al. |
| 2015/0136303 A1 * | 5/2015 | Li ......................... B05D 7/542 205/159 |
| 2015/0170923 A1 | 6/2015 | Nardi et al. |
| 2015/0279759 A1 | 10/2015 | Miyakoshi et al. |
| 2015/0305189 A1 | 10/2015 | Strader et al. |
| 2016/0027766 A1 | 1/2016 | Chung |
| 2016/0148857 A1 | 5/2016 | Lin et al. |
| 2016/0163566 A1 | 6/2016 | Chen et al. |
| 2016/0204080 A1 | 7/2016 | Kim et al. |
| 2017/0018531 A1 * | 1/2017 | Lin ......................... H01L 25/50 |
| 2017/0207204 A1 | 7/2017 | Lin et al. |
| 2017/0294422 A1 | 10/2017 | Solimando et al. |
| 2018/0019183 A1 | 1/2018 | Wang et al. |
| 2018/0240764 A1 * | 8/2018 | Hsu ........................ H01L 24/19 |
| 2018/0374773 A1 | 12/2018 | Kurosawa |
| 2019/0148262 A1 * | 5/2019 | Pei ..................... H01L 23/3677 257/713 |

FOREIGN PATENT DOCUMENTS

| | | |
|---|---|---|
| CN | 104253105 A | 12/2014 |
| CN | 104966702 A | 10/2015 |
| CN | 107665852 A | 2/2018 |
| JP | 2007281043 A | 10/2007 |
| JP | 2011061116 A | 3/2011 |
| KR | 20160085988 A | 7/2016 |
| TW | 201501223 A | 1/2015 |
| TW | 201703219 A | 1/2017 |

\* cited by examiner

METHOD OF FORMING INTEGRATED FAN-OUT PACKAGES WITH BUILT-IN HEAT SINK

PRIORITY CLAIM AND CROSS-REFERENCE

This patent application is a divisional of U.S. patent application Ser. No. 16/570,046, filed Sep. 13, 2019, entitled "Integrated Fan-Out Packages and Methods of Forming the Same," now U.S. Pat. No. 11,257,715 issued on Feb. 22, 2022, which a divisional of U.S. patent application Ser. No. 15/967,046, filed Apr. 30, 2018, entitled "Integrated Fan-Out Packages and Methods of Forming the Same," now U.S. Pat. No. 10,510,595 issued on Dec. 17, 2019, which applications are hereby incorporated by reference in their entireties.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area. As the demand for even smaller electronic devices has grown recently, there has grown a need for smaller and more creative packaging techniques of semiconductor dies.

An example of these packaging technologies is the Package-on-Package (PoP) technology. In a PoP package, a top semiconductor packages is stacked on top of a bottom semiconductor package to allow high level of integration and component density. Another example is the Multi-Chip-Module (MCM) technology, where multiple semiconductor dies are packaged in one semiconductor package to provide semiconductor devices with integrated functionalities.

The high level of integration of advanced packaging technologies enables production of semiconductor devices with enhanced functionalities and small footprints, which is advantageous for small form factor devices such as mobile phones, tablets and digital music players. Another advantage is the shortened length of the conductive paths connecting the interoperating parts within the semiconductor package. This improves the electrical performance of the semiconductor device, since shorter routing of interconnections between circuits yields faster signal propagation and reduced noise and cross-talk.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of the present disclosure are discussed in the context of semiconductor devices and methods of forming the semiconductor devices, and in particular, integrated fan-out (InFO) semiconductor packages. In some embodiments, a method of forming a semiconductor device include attaching a metal foil to the backside of a semiconductor die, and forming a molding material around the semiconductor die and the metal foil. The metal foil functions as a heat sink to facilitate heat dissipation from the semiconductor die. In some embodiments, a thermally conductive material, such as a metal paste, is formed over the backside of a semiconductor die to function as a heat sink. A molding material is formed around the semiconductor die and the thermally conductive material, and a redistribution structure is formed over the semiconductor die and the molding material.

Figure 1:
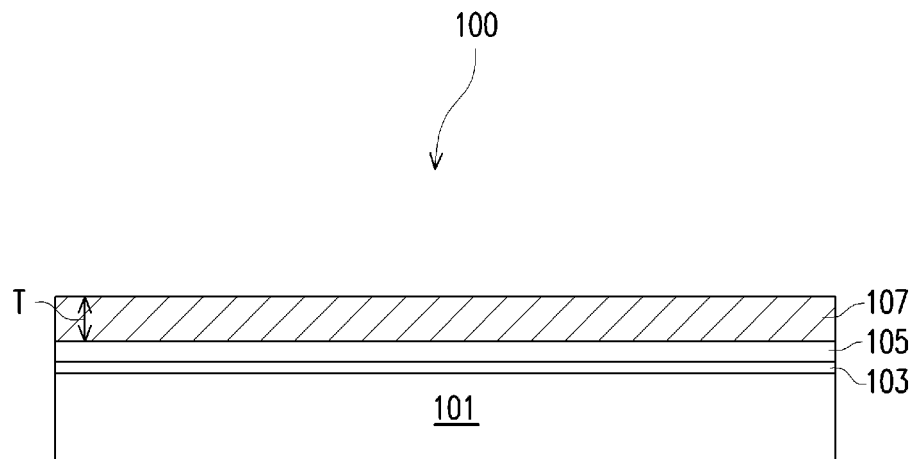
FIGS. 1-9 illustrate cross-sectional views of a semiconductor device at various stages of fabrication, in accordance with an embodiment.

FIGS. 1-9 illustrate cross-sectional views of a semiconductor device 100 at various stages of fabrication, in accordance with an embodiment. In FIG. 1, a dielectric layer 103, which may function as a release layer to facilitate a subsequent carrier de-bonding process, is formed over the carrier 101. In some embodiments, the dielectric layer 103 is omitted. A metal foil 107 is attached to the carrier 101 by an adhesive layer 105, and by the dielectric layer 103, if formed.

The carrier 101 may be made of a material such as silicon, polymer, polymer composite, metal foil, ceramic, glass, glass epoxy, beryllium oxide, tape, or other suitable material for structural support. The dielectric layer 103 is deposited or laminated over the carrier 101. The dielectric layer 103 may be photosensitive and may be easily detached from the carrier 101 by, e.g., shining an ultra-violet (UV) light on the carrier 101 in the subsequent carrier de-bonding process. For example, the dielectric layer 103 may be a light-to-heat-conversion (LTHC) film made by 3M Company of St. Paul, Minnesota.

Next, the metal foil 107 is attached to the carrier 101 (e.g., via the dielectric layer 103) by the adhesive layer 105, which adhesive layer 105 may be, e.g., a die attaching film (DAF). The metal foil 107 is pre-made (may also be referred to as pre-formed) prior to being attached to the carrier 101, in the illustrated embodiment. The metal foil 107 has a high thermal conductivity, e.g., between about 100 watts per meter-kelvin (W/(m-k)) and about 400 W/(m-k), such that the metal foil 107 functions as a heat sink for the semiconductor device 100 formed, as described in more details hereinafter. In addition, the metal foil 107 may obviate the need to form a seed layer for forming conductive pillars 109 (see FIG. 2) on the metal foil 107. By using a pre-made metal foil, manufacturing time (thus production throughput) is improved compared with a process where the metal foil 107 is formed (e.g., deposited) over the carrier 101 by physical vapor deposition (PVD), chemical vapor deposition (CVD), or the like. Furthermore, the pre-made metal foil 107 may have surfaces (e.g., upper surface and lower surface) that are smoother (e.g., more planar) than what would be achieved using a deposition process (e.g., PVD, CVD). A more planar surface may be advantageous for subsequent processing, such as photolithography and etching processes.

The metal foil 107 is a copper foil, in the illustrated embodiment, although other metal foil comprising a suitable material, such as gold, tungsten, aluminum, silver the like, or combinations thereof, may also be used. A thickness T of the metal foil 107 is between about 10 μm and about 50 μm, such as 30 μm, although other dimensions are also possible.

Figure 2:
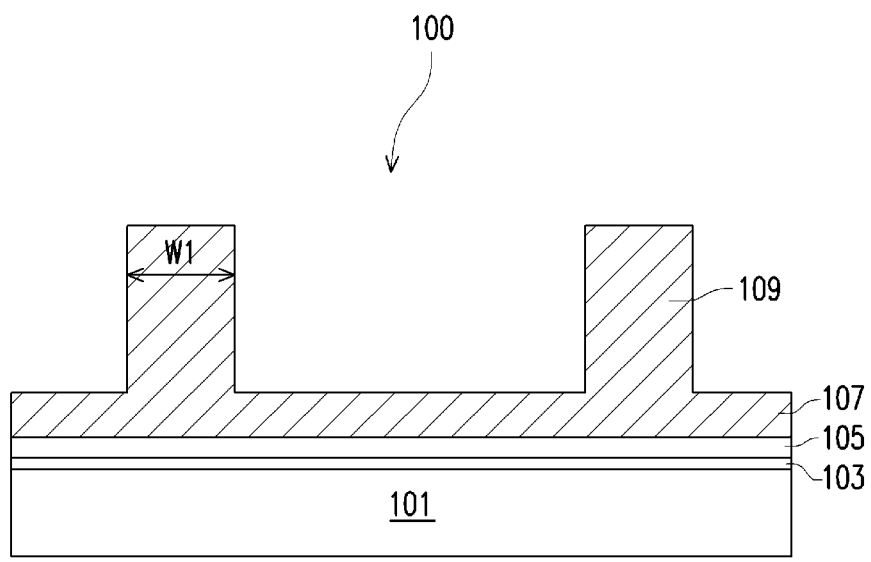

Referring to FIG. 2, the conductive pillars 109 are formed over the metal foil 107. Since the metal foil 107 (e.g., copper foil) may serve as a seed layer, the conductive pillars 109 may be formed over the metal foil 107 by forming a patterned photoresist (not shown) over the metal foil 107, where each of the openings in the patterned photoresist corresponds to a location of the conductive pillar 109 to be formed; filling the openings with an electrically conductive material such as copper using, e.g., electroplating or electroless plating; and removing the photoresist using, e.g., an ashing or a stripping process. Other methods for forming the conductive pillars 109 are also possible and are fully intended to be included within the scope of the present disclosure.

Figure 4:
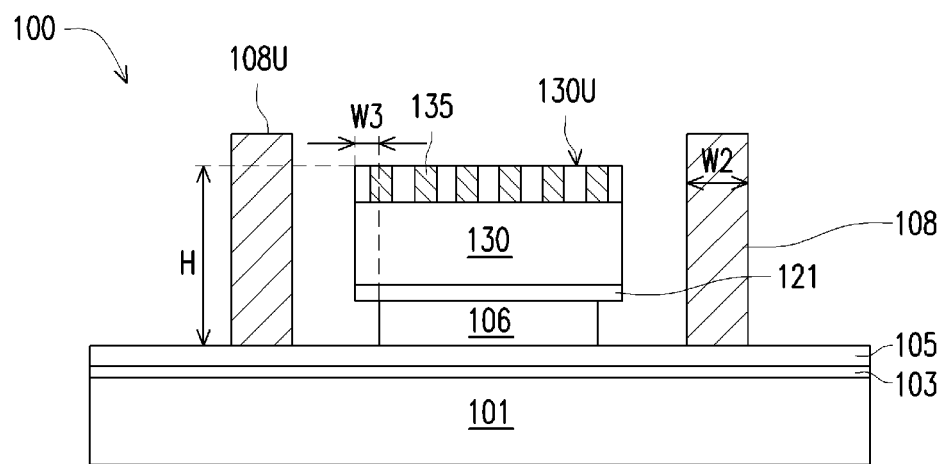

Once formed, the conductive pillars 109 may have a width $W_1$, which may be about 20 μm to about 60 μm larger than a target width $W_2$ (see FIG. 4). The larger width $W_1$ is designed to compensate for a subsequent etching process which reduces the width of the conductive pillars 109, as described hereinafter. In some embodiments, the width $W_1$ is between about 100 μm to about 300 μm, such as 190 μm, although other dimensions are also possible.

Figure 3:
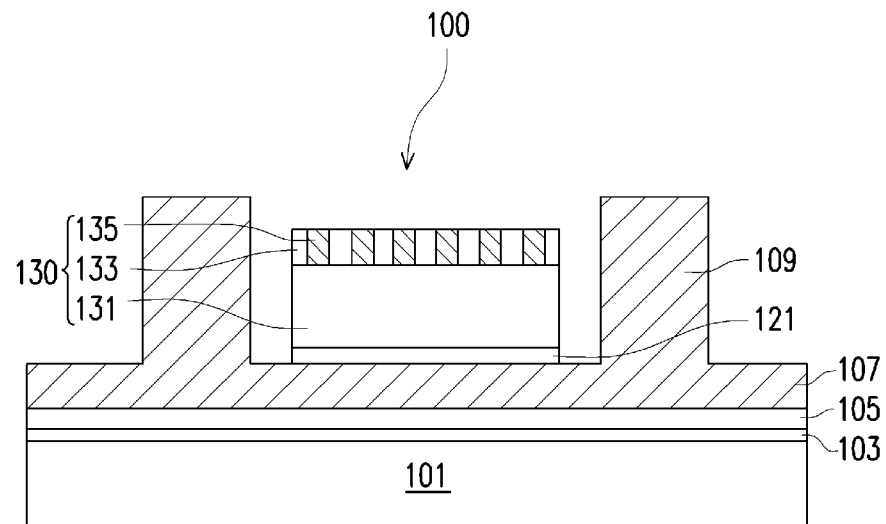

Next, in FIG. 3, a semiconductor die 130 (also referred to as a die, or an integrated circuit (IC) die) is attached to the upper surface of the metal foil 107, e.g., between the conductive pillars 109, using an adhesive layer 121. The adhesive layer 121 may be a DAF. The thermal conductivity of the DAF is generally low, such as about 0.25 W/(m-k). Therefore, in embodiments where the adhesive layer 121 is a DAF, a thin DAF with a thickness of, e.g., between about 3 μm and about 20 μm, may be used to facilitate heat dissipation from the semiconductor die 130. In some embodiments, the adhesive layer 121 is formed of a high-thermal conductivity dielectric material (e.g., a material comprising acrylic polymer, or $SiO_2$) with a thermal conductivity between, e.g., about 0.2 W/(m-k) and about 10 W/(m-k), in which case the thickness of the adhesive layer 121 may be thicker, such as between about 20 μm and about 50 μm.

Before being adhered to the metal foil 107, the die 130 may be processed according to applicable manufacturing processes to form integrated circuits in the die 130. For example, the die 130 may include a semiconductor substrate and one or more overlying metallization layers, collectively illustrated as element 131. The semiconductor substrate may be, e.g., silicon, doped or undoped, or an active layer of a semiconductor-on-insulator (SOI) substrate. The semiconductor substrate may include other semiconductor materials, such as germanium; a compound semiconductor including silicon carbide, gallium arsenic, gallium phosphide, gallium nitride, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. Devices (not shown), such as transistors, diodes, capacitors, resistors, etc., may be formed in and/or on the semiconductor substrate and may be interconnected by the metallization layers (not shown), e.g., metallization patterns in one or more dielectric layers on the semiconductor substrate, to form one or more integrated circuits.

The die 130 further comprise pads (not shown), such as aluminum pads, to which external connections are made. The pads are on what may be referred to as active side or front side of the die 130. The die 130 further comprises passivation film (not shown) at the front side of the die 130 and on portions of the pads. Openings extend through the passivation film to the pads. Die connectors 135, such as conductive pillars (for example, comprising a metal such as copper), extend into the openings of the passivation film and are mechanically and electrically coupled to the respective pads. The die connectors 135 may be formed by, for example, plating, or the like. The die connectors 135 are electrically coupled to the integrated circuits of the die 130.

A dielectric material 133 is formed on the active sides of the die 130, such as on the passivation film and/or the die connectors 135. The dielectric material 133 laterally encapsulates the die connectors 135, and the dielectric material 133 may be laterally coterminous with the die 130. The dielectric material 133 may be a polymer such as polybenzoxazole (PBO), polyimide, benzocyclobutene (BCB), or the like; a nitride such as silicon nitride or the like; an oxide such as silicon oxide, phosphosilicate glass (PSG), borosilicate glass (BSG), boron-doped phosphosilicate glass (BPSG), or the like; or a combination thereof, and may be formed, for example, by spin coating, lamination, CVD, or the like.

Next, referring to FIG. 4, an etching process is performed to remove portions of the metal foil 107. The etching process is a wet etch process, in some embodiments. The etching process may be isotropic, and may be selective to (e.g., having a higher etching rate for) the material (e.g., copper) of the conductive pillars 109 and the material of the metal foil 107 (e.g., copper foil). As a result of the etching process (e.g., a wet etch process), exterior portions of the conductive pillars 109 are removed, and after the etching process, remaining portions (e.g., interior portions) of the conductive pillars 109 and remaining portions of the metal foil 107 disposed directly under the conductive pillar 109 form conductive pillars 108 with a width $W_2$. Compared with the width $W_1$ (see FIG. 2) of the conductive pillars 109, the width $W_2$ is about 20 µm to about 60 µm smaller. In other words, due to the etching process, a distance between the sidewall of the conductive pillars 108 and its center axis (e.g., a longitudinal axis perpendicular to the upper surface of the carrier 101) is about 10 µm to about 30 µm smaller than that of the conductive pillar 109. The etching process may also reduce a height of the conductive pillar 109. Therefore, to compensate for the height loss due to the etching process, the height of the conductive pillar 109 may be formed to be, e.g., at least 10 µm to 30 µm larger than a height H of the die 130, such that after the etching process, the upper surface 108U of the conductive pillar 108 is level with or higher (e.g., further from the carrier 101) than the upper surface 130U of the die 130.

As illustrated in FIG. 4, the etching process also removes portions of the metal foil 107 to expose areas of the upper surface of the adhesive layer 105. For example, portions of the metal foil 107 disposed laterally between the conductive pillar 108 and the die 130 are removed. After the etching process, portions (labeled as a metal foil 106) of the metal foil 107 directly under the die 130 remain, portions of the metal foil 107 directly under the conductive pillar 109 remain, whereas other portions of the metal foil 107 are removed, in some embodiments. In the illustrated example of FIG. 4, under cuts are formed under the die 130 in the metal foil 106, due to the wet etch process. An offset $W_3$ between a sidewall of the die 130 and a sidewall of the metal foil 106 is between about 10 µm to about 30 µm, in some embodiments.

An optional oxidization process may be performed after the etching process to treat the conductive pillars 108. The oxidization process may form a layer of oxide (e.g., copper oxide) over the surfaces of the conductive pillars 108. The layer of oxide may advantageously increase the adhesion between the conductive pillars 108 and a subsequently formed molding material 137 (see FIG. 5).

Figure 5:
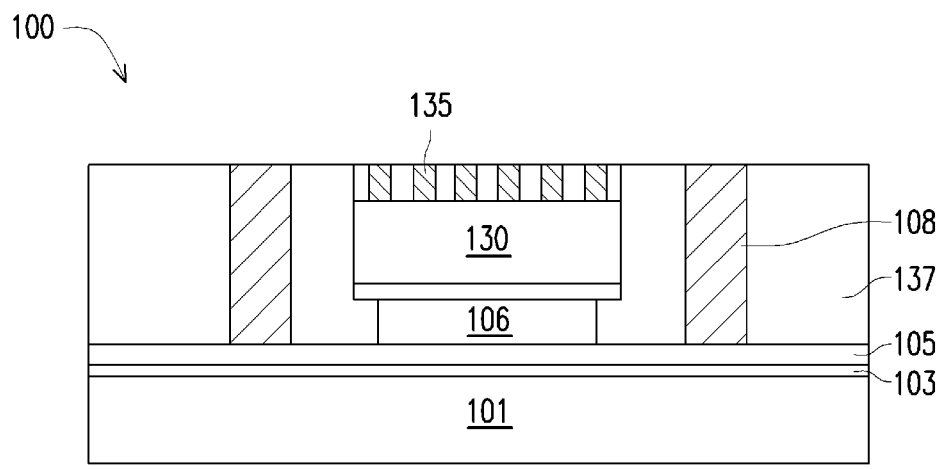

Next, in FIG. 5, the molding material 137 is formed over the adhesive layer 105. The molding material 137 surrounds the die 130, the conductive pillars 108, and the metal foil 106. The molding material 137 may comprise an epoxy, an organic polymer, a polymer with or without a silica-based or glass filler added, or other materials, as examples. In some embodiments, the molding material 137 comprises a liquid molding compound (LMC) that is a gel type liquid when applied. The molding material 137 may also comprise a liquid or solid when applied. Alternatively, the molding material 137 may comprise other insulating and/or encapsulating materials. The molding material 137 is applied using a wafer level molding process in some embodiments. The molding material 137 may be molded using, for example, compressive molding, transfer molding, or other methods.

Next, the molding material 137 is cured using a curing process, in some embodiments. The curing process may comprise heating the molding material 137 to a predetermined temperature for a predetermined period of time, using an anneal process or other heating process. The curing process may also comprise an ultra-violet (UV) light exposure process, an infrared (IR) energy exposure process, combinations thereof, or a combination thereof with a heating process. Alternatively, the molding material 137 may be cured using other methods. In some embodiments, a curing process is not included.

Next, a planarization process, such as chemical and mechanical polish (CMP), may be performed to remove excess portions of the molding material 137 over the front side of the die 130. After the planarization process, the molding material 137, the conductive pillars 108, and the die connectors 135 have a coplanar upper surface, in some embodiments. In some embodiments, the planarization process is omitted.

Figure 6:
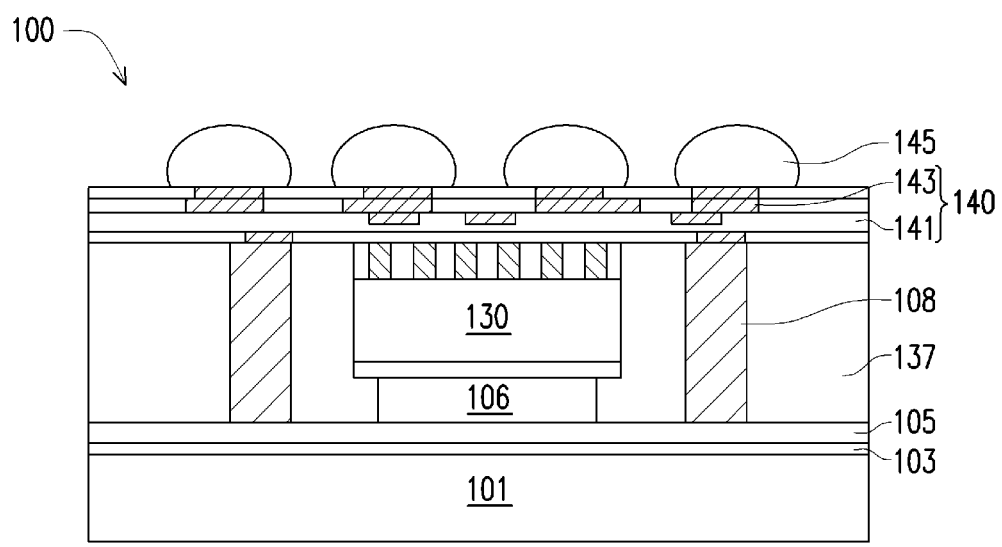

Next, in FIG. 6, a redistribution structure 140 is formed over the die 130, the conductive pillars 108, and the molding material 137. The redistribution structure 140 comprises one or more layers of electrically conductive features 143 (e.g., conductive lines and conductive vias) formed in one or more dielectric layer 141. The redistribution structure 140 is electrically coupled to the conductive pillars 108 and the die 130 (e.g., through the die connectors 135).

In some embodiments, the one or more dielectric layers 141 are formed of a polymer, such as PBO, polyimide, BCB, or the like; a nitride such as silicon nitride; an oxide such as silicon oxide, PSG, BSG, BPSG, or the like. The one or more dielectric layers 141 may be formed by a suitable deposition process, such as spin coating, CVD, laminating, the like, or a combination thereof.

In some embodiments, the conductive features of the redistribution structure 140 comprise conductive lines and conductive vias formed of a suitable conductive material such as copper, titanium, tungsten, aluminum, or the like. The redistribution structure 140 may be formed by forming a dielectric layer; forming openings in the dielectric layer to expose underlying conductive features; forming a seed layer (not shown) over the dielectric layer and in the openings; forming a patterned photoresist (not shown) with a designed pattern over the seed layer; plating (e.g., electroplating or electroless plating) the conductive material in the designed pattern and over the seed layer; and removing the photoresist and portions of seed layer on which the conductive material is not formed. The above described process may be repeated to form multiple layers of conductive features and multiple dielectric layers for the redistribution structure 140.

Other methods of forming the redistribution structure 140 are also possible and are fully intended to be included within the scope of the present disclosure. For example, damascene and/or dual-damascene process may be used to form the redistribution structure 140. In some embodiments, some layers of the conductive features of the redistribution structure 140 are formed by damascene/dual-damascene process, and some other layers of the conductive features of the redistribution structure 140 are formed by the method described above using, e.g., patterned photoresist and plating.

The number of dielectric layers 141 and the number of layers of the conductive features 143 in the redistribution structures 140 of FIG. 6 are merely non-limiting examples. Other numbers of the dielectric layers and other numbers of layers of the conductive features are also possible and are fully intended to be included within the scope of the present disclosure.

Still referring to FIG. 6, connectors 145 (may also be referred to as external connectors, conductive bumps) are formed over and electrically coupled to the conductive features (e.g., conductive lines and vias) of the redistribution structure 140. The connectors 145 are electrically coupled to the die 130 through the conductive features of the redistribution structure 140, in the illustrated embodiment. In some embodiments, at least one of the connectors 145 is electrically coupled to the conductive pillar 108 through the redistribution structure 140.

The connectors 145 may be solder balls, metal pillars, controlled collapse chip connection (C4) bumps, micro bumps, electroless nickel-electroless palladium-immersion gold technique (ENEPIG) formed bumps, combination thereof (e.g., a metal pillar having a solder ball attached thereof), or the like. The connectors 145 may include a conductive material such as solder, copper, aluminum, gold, nickel, silver, palladium, tin, the like, or a combination thereof. In some embodiments, the connectors 145 comprise a eutectic material and may comprise a solder bump or a solder ball, as examples. The connectors 145 may form a grid, such as a ball grid array (BGA). The connectors 145 may be formed using any suitable process. Although the connectors 145 are illustrated in FIG. 6 as having a partial sphere shape, the connectors 145 may comprise other shapes. For example, the connectors 145 may also comprise non-spherical conductive connectors.

In some embodiments, the connectors 145 comprise metal pillars (such as a copper pillar) formed by a sputtering, printing, electro plating, electroless plating, CVD, or the like, with or without a solder material thereon. The metal pillars may be solder free and have substantially vertical sidewalls or tapered sidewalls.

Although not shown in FIG. 6, under bump metallization (UBM) structures may be formed over the redistribution structure 140, before the connectors 145 are formed. In other words, the UBM structures may be formed between and electrically coupled to the connectors 145 and the redistribution structure 140. The UBM structures may comprise one or more layers of electrically conductive material, such as copper, tungsten, titanium, gold, nickel, the like, alloys thereof, or combinations thereof. To form the UBM structures, openings are formed in the topmost dielectric layer of the redistribution structure 140 to expose conductive features (e.g., copper lines or copper pads) of the redistribution structure 140. After the openings are formed, the UBM structures may be formed in electrical contact with the exposed conductive features.

Figure 7:
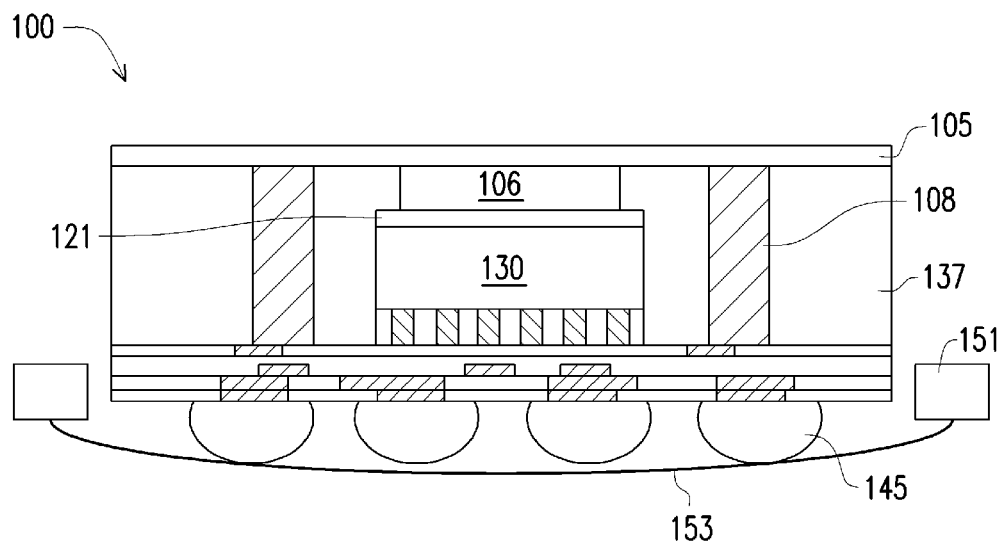

Next, in FIG. 7, the semiconductor device 100 illustrated in FIG. 6 is flipped over, and the connectors 145 are attached to a tape 153 (e.g., a dicing tape) supported by a frame 151 (e.g., a metal frame). Next, the carrier 101 is de-bonded from the semiconductor device 100 by a suitable process, such as etching, grinding, or mechanical peel off. In an embodiment where the dielectric layer 103 is an LTHC film, the carrier 101 is de-bonded by exposing the carrier 101 to a laser or UV light. The laser or UV light breaks the chemical bonds of the LTHC film that binds to the carrier 101, and the carrier 101 can then be easily detached. The dielectric layer 103 (e.g., an LTHC film) is also removed after the carrier de-bonding process, in some embodiments.

Figure 8:
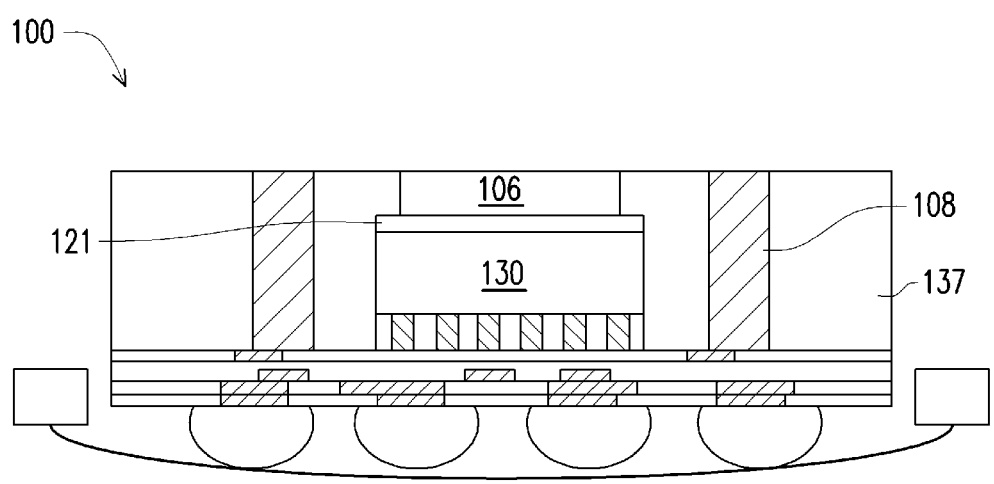

Next, in FIG. 8, a cleaning process is performed to remove the adhesive layer 105 (e.g., a DAF). The cleaning process is a dry etch process, such as a plasma process, in some embodiments. In some embodiments, the cleaning process is a wet etch process. After the cleaning process, the upper surface of the metal foil 106, the upper surface of the conductive pillars 108, and the upper surface of the molding material 137 are exposed. In the illustrated embodiment, the upper surface of the metal foil 106, the upper surface of the conductive pillars 108, and the upper surface of the molding material 137 are level with each other. The exposed metal foil 106 advantageously facilitates heat dissipation of the die 130, such that the heat generated by the die 130 can easily dissipate through the adhesive layer 121 and the metal foil 106. For this reason, the metal foil 106 may also be referred to as a heat sink in the discussion herein.

Figure 9:
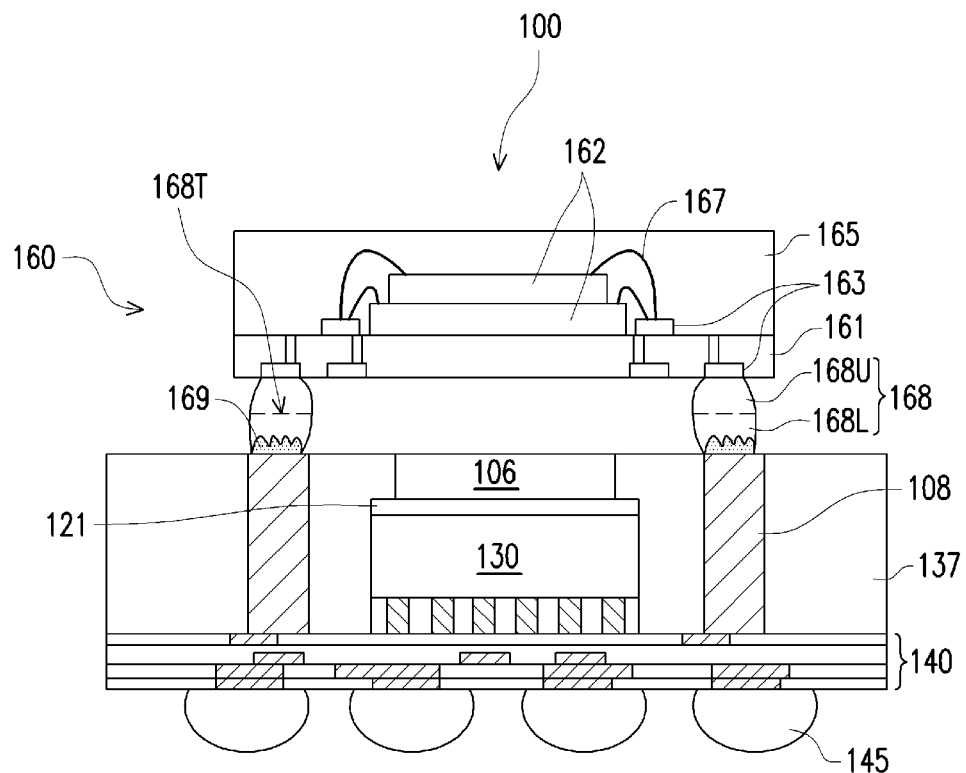

Referring next to FIG. 9, a semiconductor package 160 (also referred to as a top package), such as a package comprising memory devices, is attached to the semiconductor device 100 shown in FIG. 8 (also referred to as a bottom package) to form the semiconductor device 100 in FIG. 9, thereby forming a semiconductor device 100 with a package-on-package (PoP) structure.

As illustrated in FIG. 9, the semiconductor package 160 has a substrate 161 and one or more semiconductor dies 162 (e.g., memory dies) attached to an upper surface of the substrate 161. In some embodiments, the substrate 161 includes silicon, gallium arsenide, silicon on insulator ("SOI") or other similar materials. In some embodiments, the substrate 161 is a multiple-layer circuit board. In some embodiments, the substrate 161 includes bismaleimide triazine (BT) resin, FR-4 (a composite material composed of woven fiberglass cloth with an epoxy resin binder that is flame resistant), ceramic, glass, plastic, tape, film, or other supporting materials. The substrate 161 may include conductive features (e.g., conductive lines and vias) formed in/on the substrate 161. As illustrated in FIG. 9, the substrate 161 has conductive pads 163 formed on the upper surface and a lower surface of the substrate 161, which conductive pads 163 are electrically coupled to the conductive features of the substrate 161. The one or more semiconductor dies 162 are electrically coupled to the conductive pads 163 by, e.g., bonding wires 167. A molding material 165, which may comprise an epoxy, an organic polymer, a polymer, or the like, is formed over the substrate 161 and around the semiconductor dies 162. In some embodiments, the molding material 165 are conterminous with the substrate 161, as illustrated in FIG. 9.

In accordance with some embodiments, a reflow process is performed to electrically and mechanically coupled the semiconductor package 160 to the conductive pillars 108. Conductive joints 168 are formed between the conductive pads 163 and the conductive pillars 108. In some embodiments, solder paste (not shown) is deposited on the upper surfaces of the conductive pillars 108, and the conductive joints 168 are formed by bonding external connectors of the semiconductor package 160 with the melted solder paste. FIG. 9 illustrates interfaces 168T between upper portions 168U of the conductive joints 168 and lower portions 168L of the conductive joints 168, where the upper portions 168U may correspond to at least portions of the external connectors of the semiconductor package 160 and the lower portions 168L may correspond to at least portions of the solder paste used to form the conductive joint 168. For simplicity, the interfaces 168T may not be illustrated in subsequent drawings. In some embodiments, the conductive joints 168 comprise solder regions, conductive pillars (e.g., copper pillars with solder regions on at least end surfaces of the copper pillars), or any other suitable conductive joints. An inter-metallic compound (IMC) 169 may be formed at the interface between the conductive joints 168 and the conductive pillars 108. Although not shown in FIG. 9, the IMC may also be formed at the interface between the conductive joints 168 and the conductive pads 163.

Although not illustrated, a dicing process may be performed after the conductive joints 168 are formed to separate the semiconductor device 100 from other neighboring semiconductor devices (not shown) formed in the same processing steps, thereby forming a plurality of individual semiconductor devices 100. The individual semiconductor devices 100 may then be removed from the tape 153.

Variations to the disclosed embodiments are possible and are fully intended to be included within the scope of the present disclosure. For example, while FIG. 9 illustrates two conductive pillars 108, the number of conductive pillars 108 may be more or less than two. In addition, although the die 130 is illustrated in FIG. 9 to be in the middle region of the semiconductor device 100 and surrounded by the conductive pillars 108, the die 130 may be disposed in a peripheral region of the semiconductor device 100, and the conductive pillars may not surround the die 130. As another example, the die 130 may be attached to the metal foil 107 before the conductive pillars 109 are formed.

Figure 10:
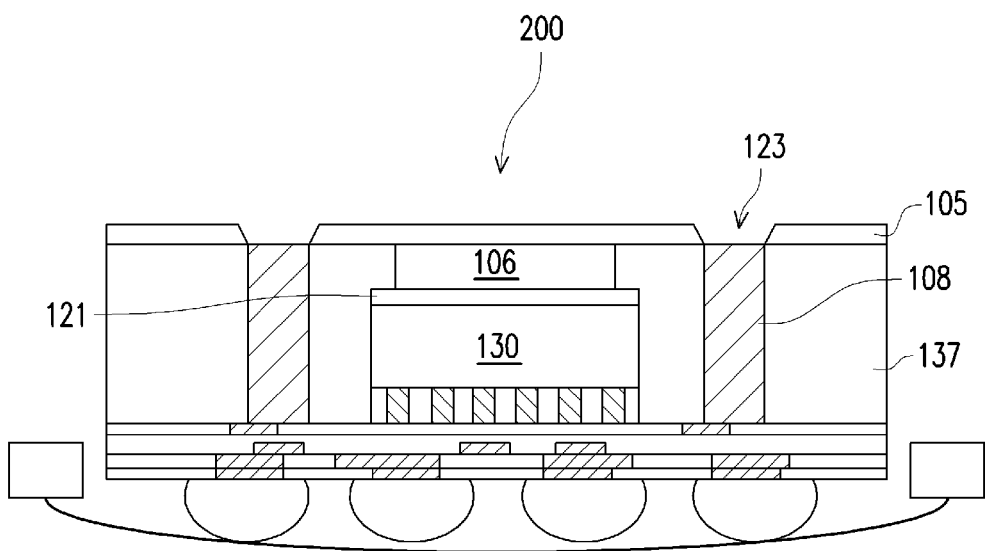
FIGS. 10-11 illustrate cross-sectional views of a semiconductor device at various stages of fabrication, in accordance with an embodiment.
Figure 11:
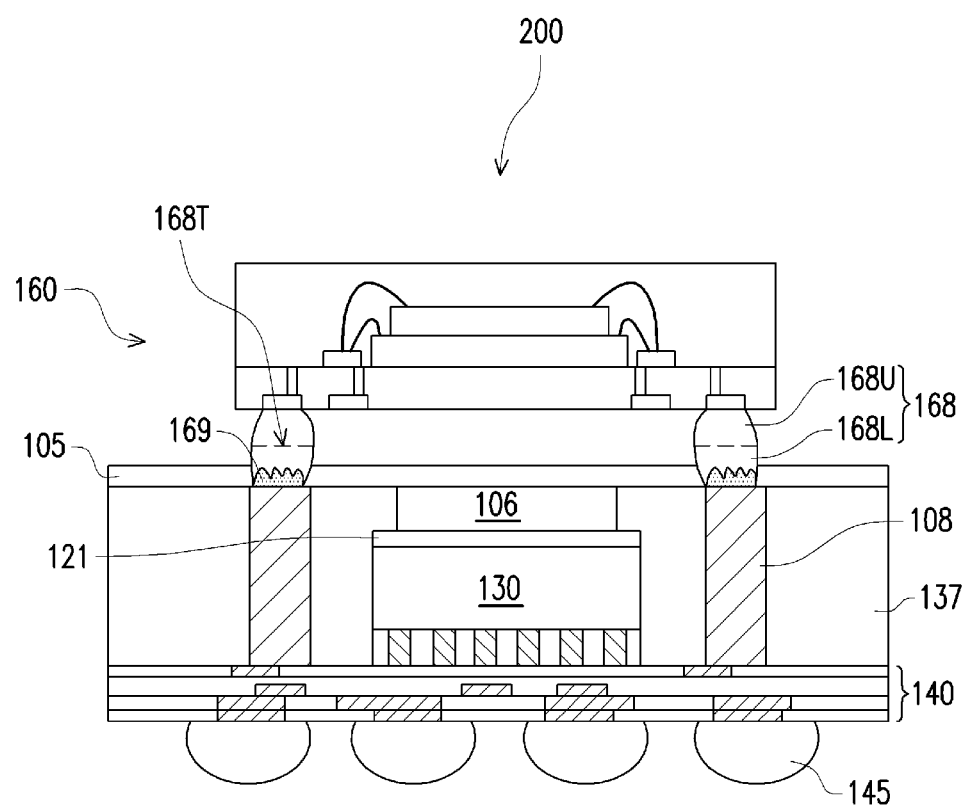

FIGS. 10-11 illustrate cross-sectional views of a semiconductor device 200 at various stages of fabrication, in accordance with an embodiment. The processing illustrated in FIGS. 10 and 11 follow the processing shown in FIG. 7. In other words, FIGS. 1-7, 10, and 11 illustrate the processing steps for fabricating the semiconductor device 200, in some embodiments. Unless otherwise stated, similar numerals in FIGS. 10-11 illustrate the same or similar components as in FIGS. 1-10, and are formed by the same or similar formation methods, thus details may not be repeated.

Referring to FIG. 10, after the processing of FIG. 7, openings 123 are formed in the adhesive layer 105 to expose upper surfaces of the conductive pillars 108. The openings 123 may be formed by laser drilling, etching (e.g., dry etching or wet etching), the like, or combinations thereof. Although not shown, solder paste may be formed in the openings 123 prior to bonding with the semiconductor package 160 (see FIG. 11).

Next, in FIG. 11, the semiconductor package 160 is bonded to the conductive pillars 108 to form the semiconductor device 200 with a PoP structure. Conductive joints 168 are formed between the semiconductor package 160 and the conductive pillars 108. Processing is the same or similar to those discussed above with reference to FIG. 10, thus details are not repeated.

By keeping the adhesive layer 105 in the semiconductor device 200, the cleaning process (see discussion with reference to FIG. 8) used to remove the adhesive layer 105 is not performed, thus reducing the processing cost and processing time. Since the adhesive layer 105 (e.g., a DAF) may have a lower thermal conductivity than the metal foil 106, the efficiency of heat dissipation for the semiconductor device 200 may be lower than that of the semiconductor device 100 of FIG. 10. In some embodiments, the adhesive layer 105 is formed of a high-thermal conductivity dielectric material having a thermal conductivity between, e.g., about 0.2 W/(m-k) and about 10 W/(m-k), to compensate for, at least in part, the loss in the efficiency of heat dissipation for the semiconductor device 200.

Figure 12:
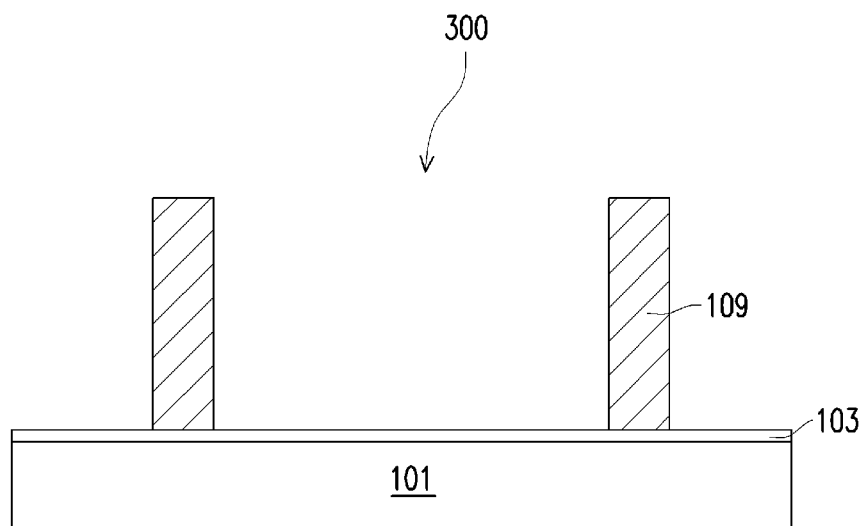
FIGS. 12-19 illustrate cross-sectional views of a semiconductor device at various stages of fabrication, in accordance with an embodiment.

FIGS. 12-19 illustrate cross-sectional views of a semiconductor device 300 at various stages of fabrication, in accordance with an embodiment. Unless otherwise stated, similar numerals in FIGS. 12-11 illustrate the same or similar components as in FIGS. 1-10, and are formed by the same or similar formation methods, thus details may not be repeated.

Referring to FIG. 12, the dielectric layer 103, such as an LTHC film, is formed over the carrier 101. Conductive pillars 109 are formed over the dielectric layer 103. The conductive pillars 109 may be formed by forming a seed layer (not shown) over the dielectric layer 103; forming a patterned photoresist (not shown) over the seed layer, where each of the openings in the patterned photoresist corresponds to a location of the conductive pillar 109 to be formed; filling the openings with the electrically conductive material such as copper using, e.g., electroplating or electroless plating; removing the photoresist using, e.g., an ashing or a stripping process; and removing portions of the seed layer on which the conductive pillars 109 are not formed. Other methods for forming the conductive pillars 109 are also possible and are fully intended to be included within the scope of the present disclosure.

Figure 13:
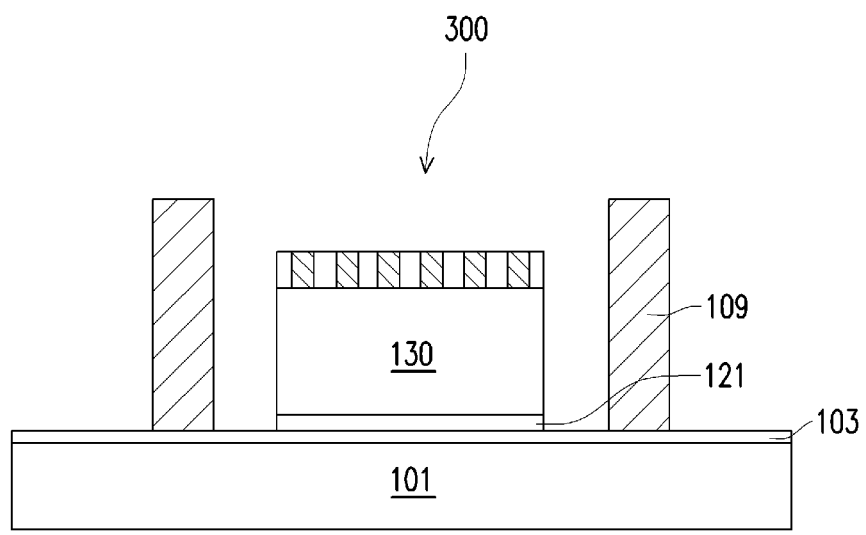

Next, in FIG. 13, the backside of the semiconductor die 130 is attached to the dielectric layer 103 by an adhesive layer 121 (e.g., a DAF). The adhesive layer 121 may be a DAF with a low thermal conductivity of about 0.25 W/(m-k) with a thickness between about 3 μm and about 10 μm. In some embodiments, the adhesive layer 121 is formed a high-thermal conductivity dielectric material with a thermal conductivity between about 0.2 W/(m-k) and about 10 W/(m-k) and a thickness between about 20 μm and about 50 μm.

An optional oxidization process may be performed to treat the conductive pillars 109. The oxidization process may form a layer of oxide (e.g., copper oxide) over the surfaces of the conductive pillars 109. The layer of oxide may advantageously increase the adhesion between the conductive pillars 109 and the subsequently formed molding material 137.

Figure 14:
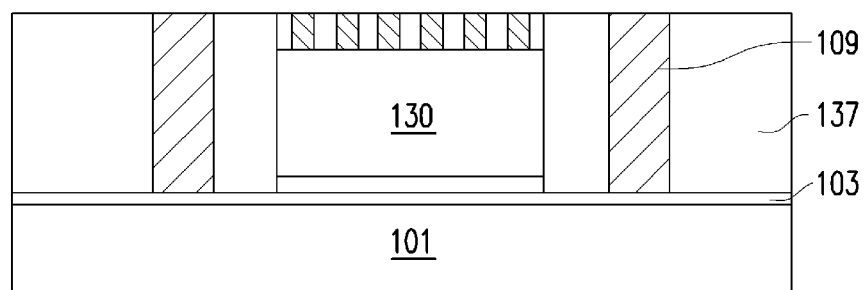

Next, in FIG. 14, the molding material 137 is formed over the dielectric layer 103. The molding material 137 surrounds the die 130 and the conductive pillars 109. A planarization process, such as CMP, may be performed to remove excess portions of the molding material 137 over the die 130, and to achieve a coplanar upper surface between the conductive pillars 109, the molding material 137, and the die 130. In some embodiments, the planarization process is omitted.

Figure 15:
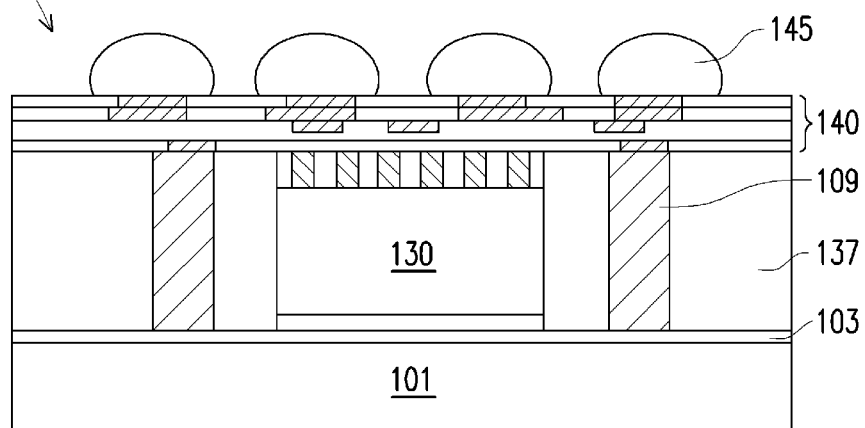

Next, in FIG. 15, the redistribution structure 140 is formed over the die 130, the conductive pillars 109, and the molding material 137. The redistribution structure 140 is electrically coupled to the die 130 and the conductive pillars 109, in the illustrated embodiment. In addition, the connectors 145 are formed over and electrically coupled to the redistribution structure 140. In some embodiments, at least one of the connectors 145 is electrically coupled to the conductive pillar 109 through the redistribution structure 140. Although not illustrated, UBM structures may be formed between the connectors 145 and the redistribution structure 140.

Figure 16:
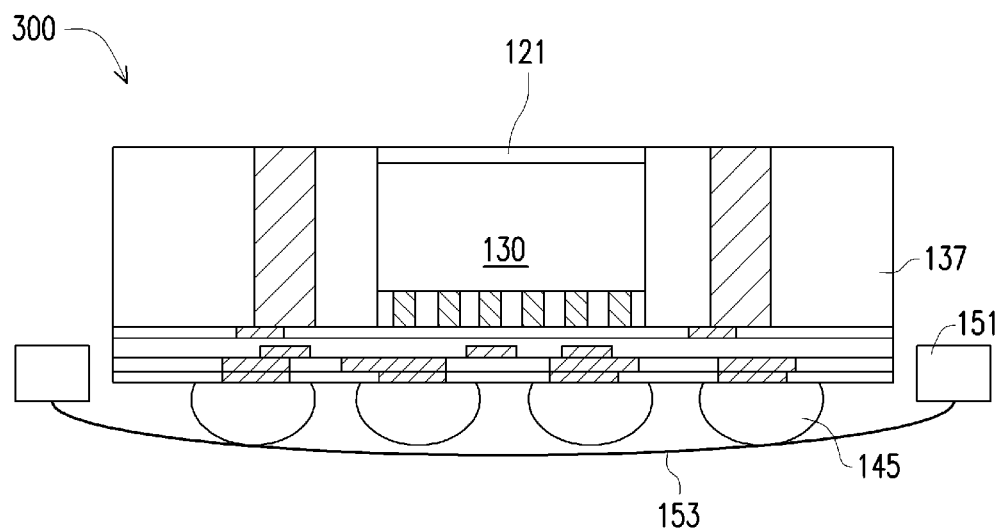

Next, refer to FIG. 16, the semiconductor device 300 in FIG. 15 is flipped over, and the connectors 145 are attached to the tape 153 supported by the frame 151. Next, the carrier 101 is de-bonded from the semiconductor device 300. After the carrier de-bonding process, a cleaning process is performed to remove the dielectric layer 103 (e.g., an LTHC film). The cleaning process may be performed using a suitable etchant, such as hydrochloric acid (HCl), or using the RCA cleaning process used in semiconductor manufacturing.

Figure 17:
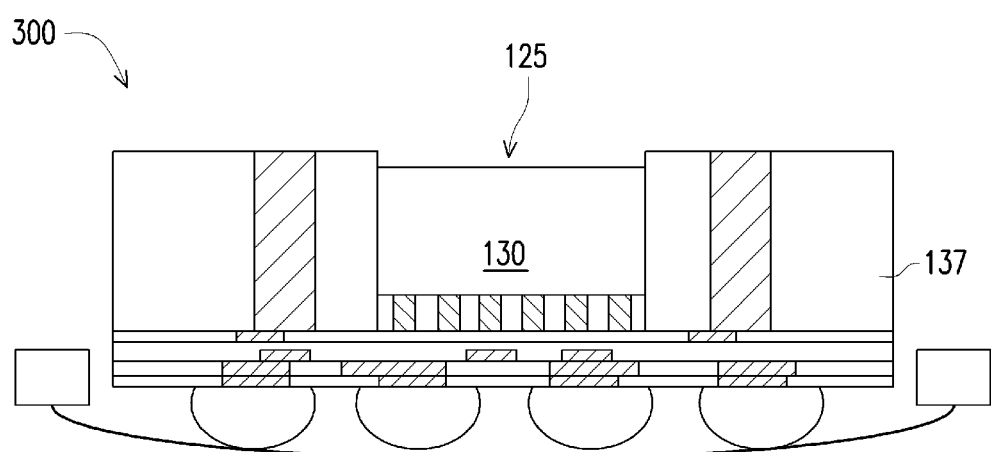

Next, in FIG. 17, the adhesive layer 121 (e.g., a DAF) is removed. A suitable etching process, such as a plasma etch process using an etching gas comprising hydrogen fluoride (HF), oxygen (O2), the like, or combinations thereof, may be performed to remove the adhesive layer 121. A carrier gas, such as argon (Ar), may be used to carry the etching gas. After the adhesive layer 121 is removed, a recess 125 is formed in the molding material 137. The recess 125 exposes the backside of the die 130, as illustrated in FIG. 17.

Figure 18:
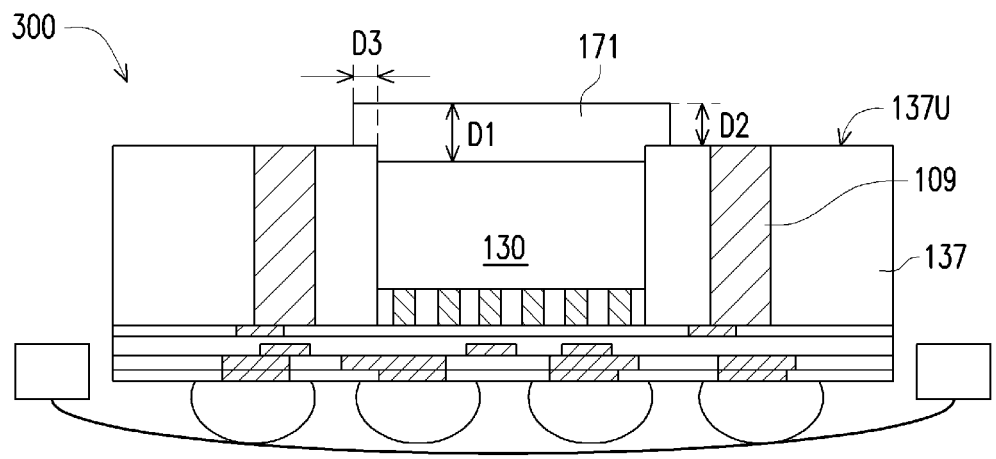

Referring next to FIG. 18, a thermally conductive material 171 is formed over the backside of the die 130. The thermally conductive material 171 fills the recess 125 (see FIG. 17) and extends over the upper surfaces of the molding material 137. The thermally conductive material 171 has a high thermal conductivity, e.g., between about 100 W/(m-k) and about 400 W/(m-k), and functions as a heat sink to facilitate heat dissipation of the die 130. Therefore, the thermally conductive material 171 may also be referred to as a heat sink in the discussion herein.

In some embodiments, the thermally conductive material 171 is a metal paste that may comprise an adhesive material such as epoxy with metal fillers (e.g., silver particles, copper particles, aluminum particles) dispersed therein, and therefore, the thermally conductive material 171 is electrically conductive, in the illustrated embodiment. The thermally conductive material 171 is a silver paste, a copper paste, an aluminum paste, or the like, in some embodiments. In some embodiments, the thermally conductive material 171 has good thermal conductivity (e.g., larger than 15 W/(m-k)), and may additionally have a high heat capacity (e.g. about 1700 joules per gram per degree Celsius (J/(g ° C.)) or larger). The thermally conductive material 171 may be formed by, e.g., depositing a metal paste in the recess 125, although depending on the composition (e.g., material) of the thermally conductive material 171, other suitable method, such as CVD, sputtering, plating, dispensing, jetting, printing, thermal bonding may also be used to form the thermally conductive material 171.

The material for the thermally conductive material 171 is not limited to metal paste. Instead, any material with good thermal conductivity may be used. As an example, carbon nanotubes may be formed in the recess 125 and used as the thermally conductive material 171. The carbon nanotubes may be formed to extend from the backside of the die 130 to above the upper surface of the molding material 137. The ranges for the thermal conductivity and the heat capacity described above for the thermally conductive material 171 are for illustrated purpose only and not limiting, other ranges for the thermal conductivity and the heat capacity are possible and are fully intended to be included within the scope of the present disclosure.

As illustrated in FIG. 18, the thermally conductive material 171 has an lower portion extending from the backside of the die 130 to the upper surface 137U of the molding material 137, and has an upper portion extending above the upper surface 137U of the molding material 137. In an embodiment, a thickness $D_2$ of the upper portion of the thermally conductive material 171 is between about 10 μm and about 100 μm, and a total thickness $D_1$ of the thermally conductive material 171 is between about 10 μm and about 150 μm. As illustrated in FIG. 18, the upper portion of the thermally conductive material 171 extends laterally beyond boundaries (e.g., sidewalls) of the die 130, and forms an overhang over the die 130. The width $D_3$ of the overhang portion of the thermally conductive material 171 is between about 10 μm and about 20 μm, in some embodiments. One skilled in the art will appreciate that the dimensions of the thermally conductive material 171 discussed herein are for illustration purpose and not limiting. Other dimensions are also possible and are fully intended to be included within the scope of the present disclosure.

Figure 19:
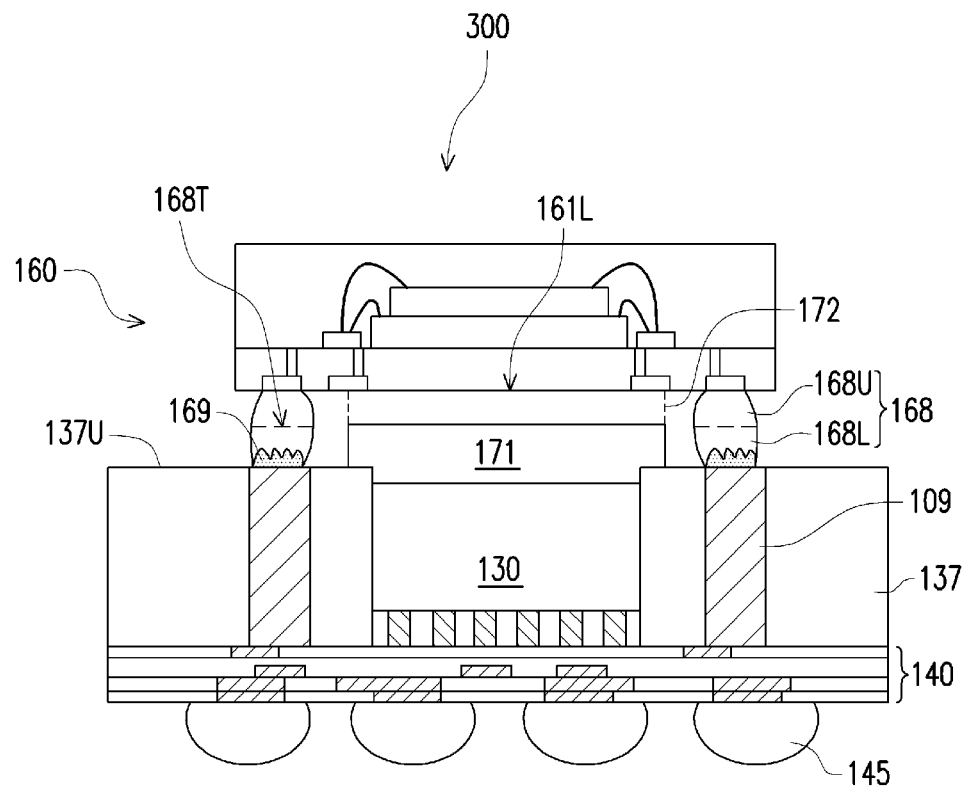

Referring next to FIG. 19, the semiconductor package 160 is bonded to the conductive pillars 109 to form the semiconductor device 300 with a PoP structure. Conductive joints 168 are formed between the semiconductor package 160 and the conductive pillars 109. A reflow process may be performed to form the conductive joints 168. The thermally conductive material 171 (e.g., a metal paste) may be cured by the reflow process. Processing is otherwise the same or similar to those discussed above with reference to FIG. 10, thus details are not repeated.

Variations of the disclosed embodiments are possible and are fully intended to be included within the scope of the present disclosure. For example, although the upper surface of the thermally conductive material 171 is illustrated to be between the upper surface 137U of the molding material 137 and the lower surface 161L of the semiconductor package 160 in FIG. 19, in other embodiments, the upper surface of the thermally conductive material 171 may contact the lower surface 161L of the semiconductor package 160. In other words, the thermally conductive material 171 may extend continuously from the backside of the die 130 to the lower surface 161L of the semiconductor package 160, as illustrated by the dotted line 172 in FIG. 19. As another example, the upper surface of the thermally conductive material 171 may be level with, or lower than (e.g., closer to the redistribution structure 140), the upper surface 137U of the molding material 137.

Figure 20:
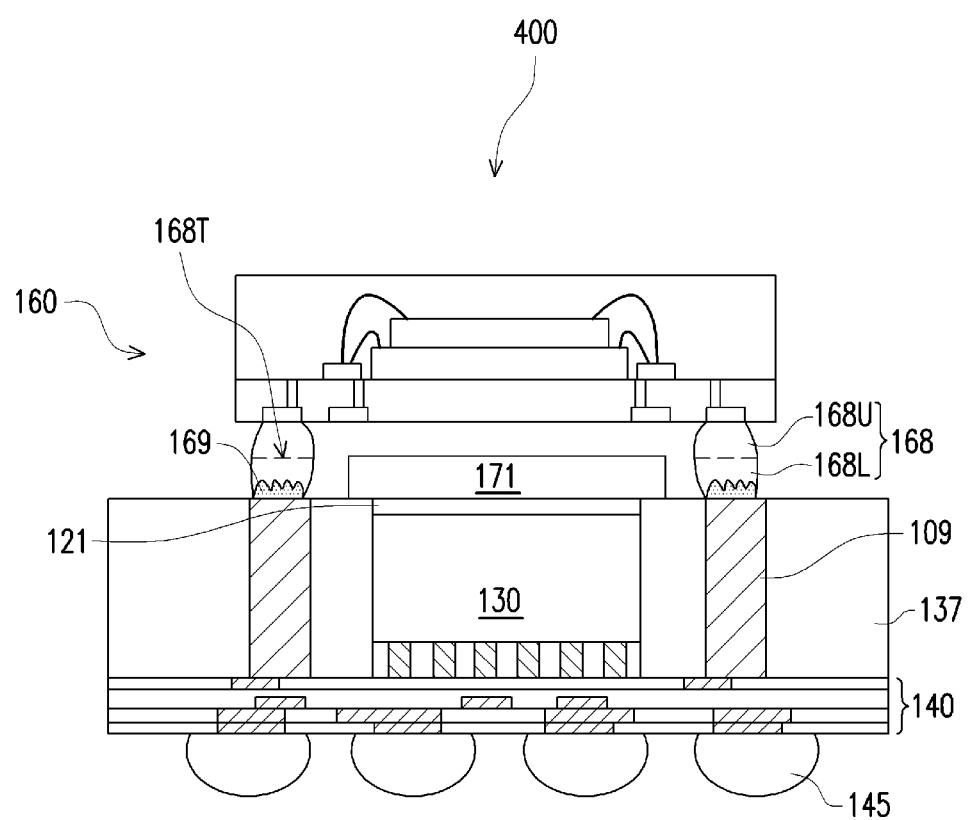
FIG. 20 illustrates a cross-sectional view of a semiconductor device, in accordance with an embodiment.

FIG. 20 illustrates a cross-sectional view of a semiconductor device 400 at a stage of fabrication, in accordance with an embodiment. The processing illustrated in FIG. 20 follows the processing shown in FIG. 16. In other words, FIGS. 12-16 and 20 illustrate the processing steps for fabricating the semiconductor device 400, in some embodiments. Unless otherwise stated, similar numerals in FIGS. 12-16 and 20 illustrate the same or similar components as in FIGS. 1-10, and are formed by the same or similar formation methods, thus details may not be repeated.

Referring to FIG. 20, after the carrier 101 is de-bonded and the dielectric layer 103 is removed (see FIG. 16), the thermally conductive material 171 is formed over the adhesive layer 121 (e.g., a DAF) and over the molding material 137. The thermally conductive material 171 has a thickness between about 10 μm and about 100 μm, in some embodiments. As illustrated in FIG. 20, the thermally conductive material 171 extends laterally beyond boundaries (e.g., sidewalls) of the die 130, and forms an overhang over the die 130. The width (similar to $D_3$ in FIG. 18) of the overhang portion of the thermally conductive material 171 is between about 10 μm and about 20 μm, in some embodiments.

One skilled in the art will appreciate that the dimensions of the thermally conductive material 171 discussed herein are for illustration purpose and not limiting. Other dimensions are also possible and are fully intended to be included within the scope of the present disclosure. In addition, variations of the disclosed embodiment are possible. For example, the upper surface of the thermally conductive material 171 may contact the lower surface of the semiconductor package 160, may be level with, or may be lower (e.g. closer to the redistribution structure 140) than the upper surface of the molding material 137. These and other variations are fully intended to be included within the scope of the present disclosure.

Compared with the semiconductor device 300 illustrated in FIG. 19, the processing steps related to the removal of the adhesive layer 121 is omitted for the semiconductor device 400 in FIG. 20, thereby reducing the number of processing steps and processing time. The adhesive layer 121, e.g., a DAF, may have a lower thermal conductivity than the thermally conductive material 171. To compensate, at least in part, the loss in the efficiency of heat dissipation, the adhesive layer 121 may be formed of a high-thermal conductivity dielectric material, e.g., with a thermal conductivity between about 0.2 W/(m-k) and about 10 W/(m-k).

Figure 21:
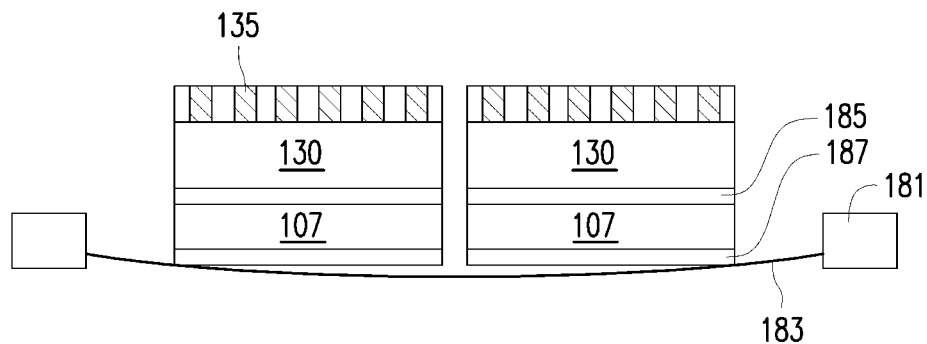
FIG. 21 illustrates a cross-sectional view of a semiconductor die, in accordance with an embodiment.

FIG. 21 illustrates the formation of a plurality of dies 130, each of which having a metal foil 107 attached to its backside, in some embodiments. The dies 130 formed in FIG. 21 may be used for forming the semiconductor device 500 illustrated in FIG. 27. As illustrated in FIG. 21, a plurality of dies 130 are formed on a wafer simultaneously (e.g., in the same processing steps). Next, the metal foil 107, which is pre-formed, is attached to the backside of the wafer (e.g., corresponding to the backsides of the dies 130) using an adhesive layer 185. The metal foil 107 may have a thickness between about 10 μm and about 50 μm, such as 30 μm. As discussed above with reference to FIG. 1, the metal foil 107 has high thermal conductivity (e.g., between about 100 W/(m-k) and about 400 W/(m-k)) and functions as a heat sink in the semiconductor device 500 (see FIG. 27) formed. Therefore, the metal foil 107 may also be referred to as heat sink in the discussion herein. The adhesive layer 185 is a dielectric layer such as a DAF, in some embodiments. As illustrated in FIG. 21, a dielectric layer 187 is formed on the metal foil 107, with the metal foil 107 between the dielectric layer 187 and the adhesive layer 185. The dielectric layer 187 is an adhesive layer, in some embodiments.

Still referring to FIG. 21, the wafer is then attached to a tape 183 (e.g., a dicing tape) supported by a frame 181. Dicing is then performed to separate the plurality of dies 130 and to form a plurality of individual dies 130, each of which has a metal foil 107 attached to the backside.

FIGS. 22-27 illustrate cross-sectional views of a semiconductor device 500 at various stages of fabrication, in accordance with an embodiment. Unless otherwise stated, similar numerals in FIGS. 22-27 illustrate the same or similar components as in FIGS. 1-10, and are formed by the same or similar formation methods, thus details may not be repeated.

Figure 22:
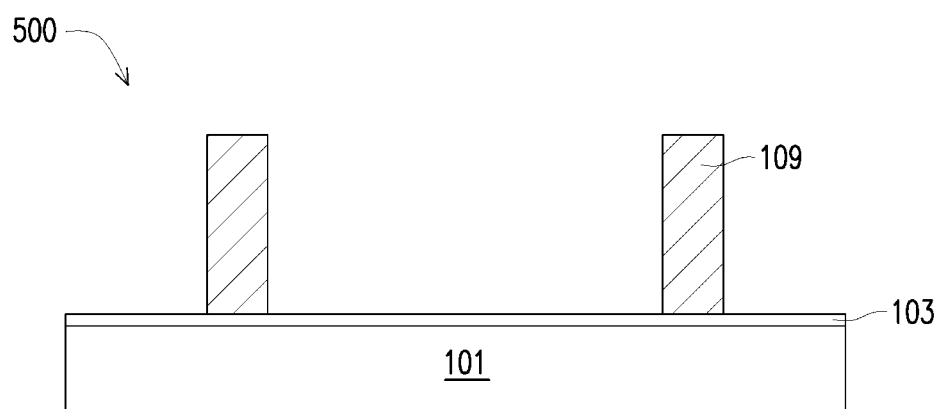
FIGS. 22-27 illustrate cross-sectional views of a semiconductor device at various stages of fabrication, in accordance with an embodiment.

Referring to FIG. 22, a dielectric layer 103, which may be an LTHC film, is formed over the carrier 101. Next, the conductive pillars 109 are formed over the dielectric layer 103. An optional oxidization process may be performed to form an oxide layer over the conductive pillars 109 to increase the adhesion between the conductive pillars 109 and the subsequently formed molding material 137.

Figure 23:
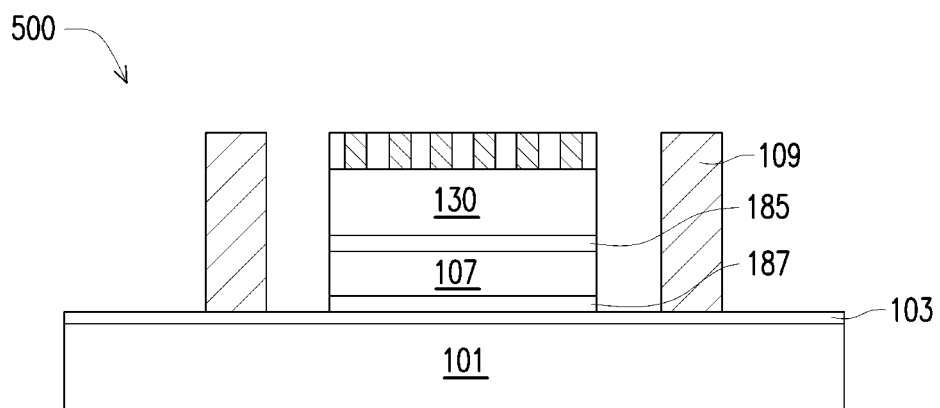

Next, in FIG. 23, the die 130 with the metal foil 107 attached to the backside (see also FIG. 21) is attached to the dielectric layer 103 by the dielectric layer 187 (e.g., a DAF).

Figure 24:
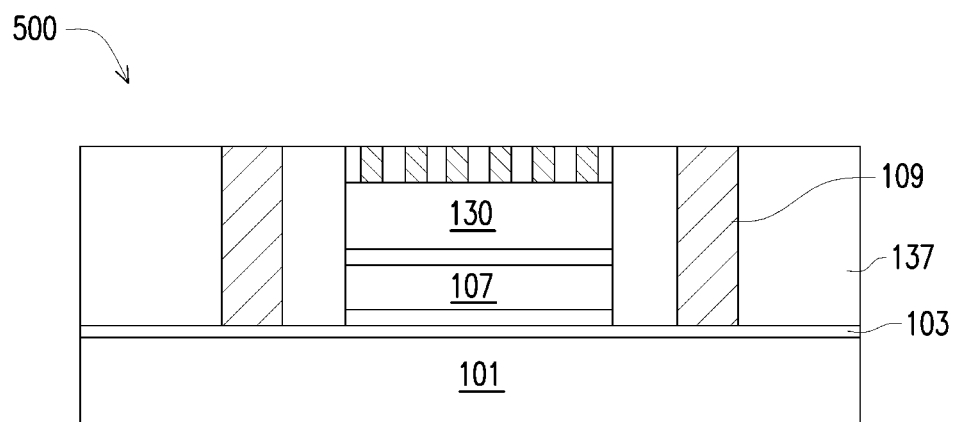

Referring next to FIG. 24, the molding material 137 is formed over the dielectric layer 103. The molding material 137 surrounds the die 130, the metal foil 107, and the conductive pillars 109, in the illustrated example. A planarization process, such as CMP, may be performed to remove excess portions of the molding material 137, such that a planar upper surface is achieved between the conductive pillars 109, the die 130, and the molding material 137. In some embodiments, the planarization process is omitted.

Figure 25:
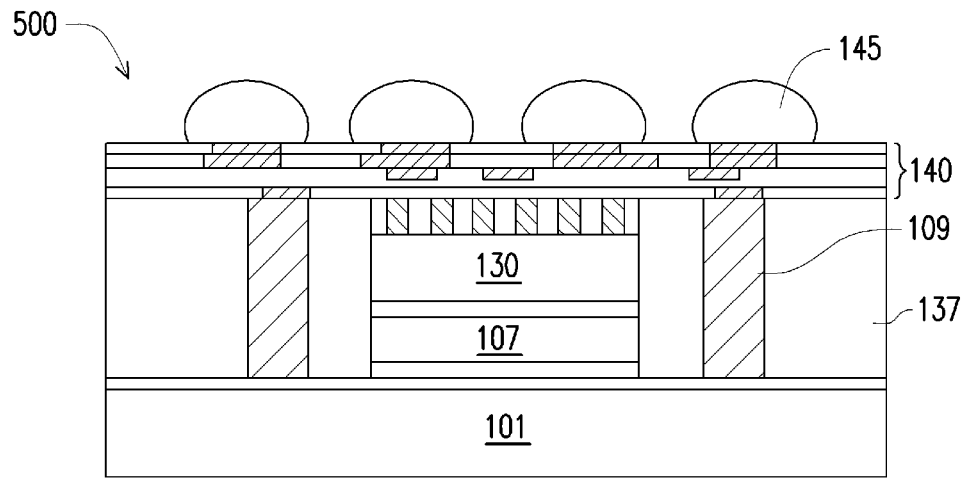

Next, in FIG. 25, the redistribution structure 140 is formed over the die 130, the conductive pillars 109, and the molding material 137. The redistribution structure 140 is electrically coupled to the conductive pillars 109 and the die 130, in the illustrated embodiment. In addition, the connectors 145 are formed over and electrically coupled to the redistribution structure 140. In some embodiments, at least one of the connectors 145 is electrically coupled to the conductive pillar 109 through the redistribution structure 140. Although not illustrated, UBM structures may be formed between the connectors 145 and the redistribution structure 140.

Figure 26:
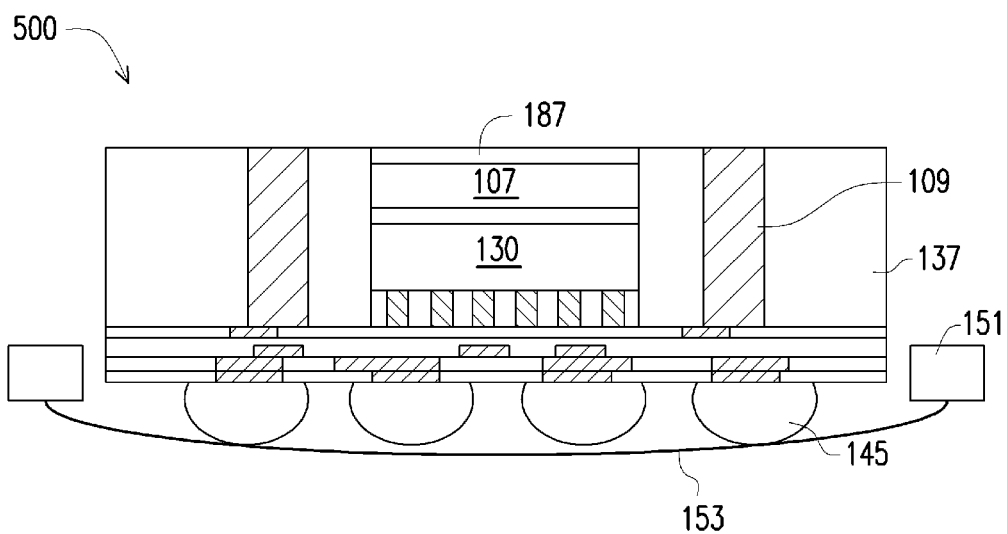

Next, in FIG. 26, the semiconductor device 500 illustrated in FIG. 25 is flipped over, and the connectors 145 are attached to the tape 153 supported by the frame 151. Next, the carrier 101 is removed from the semiconductor device 500 by a carrier-de-bonding process. The dielectric layer 103 is removed after the carrier de-bonding process, in some embodiments. An optional cleaning process (e.g., an etching process) may be performed to remove residues of the dielectric layer 103. As illustrated in FIG. 26, after the carrier de-bonding process, the dielectric layer 187, the conductive pillars 109, and the molding material 137 have a coplanar upper surface.

Figure 27:
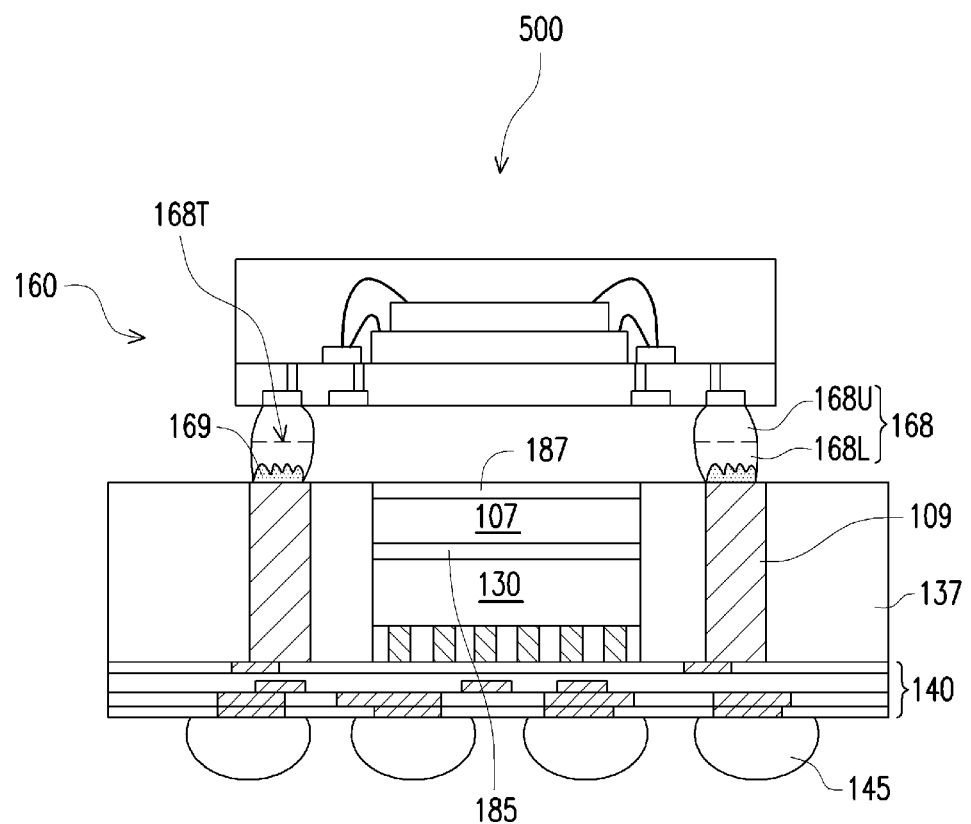

Next, in FIG. 27, the semiconductor package 160 is bonded to the conductive pillars 109 to form the semiconductor device 500 with a PoP structure. Conductive joints 168 are formed between the semiconductor package 160 and the conductive pillars 109. Processing is the same or similar to those discussed above with reference to FIG. 10, thus details are not repeated.

By attaching a pre-made metal foil 107 to the backside of the die 130, the presently disclosed method obviates the need to form (e.g., by PVD, CVD) the metal foil over the carrier 101. Since the metal foil (e.g., copper foil) and the carrier 101 (e.g., glass carrier) may have different coefficients of thermal expansion (CTEs), the presently disclosed method reduces or avoids warpage of the semiconductor device 500 caused by CTE mismatch during fabrication.

Figure 28:
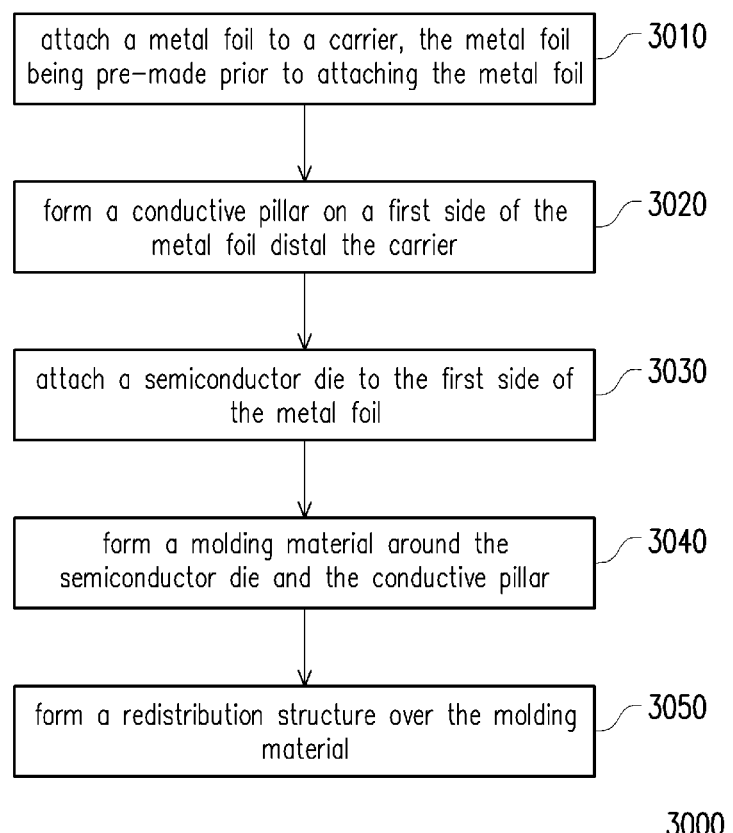
FIG. 28 illustrates a flow char of a method for forming a semiconductor device, in accordance with some embodiments.

FIG. 28 illustrates a flow chart of a method 3000 of fabricating a semiconductor device, in accordance with some embodiments. It should be understood that the embodiment method shown in FIG. 28 is merely an example of many possible embodiment methods. One of ordinary skill in the art would recognize many variations, alternatives, and modifications. For example, various steps as illustrated in FIG. 28 may be added, removed, replaced, rearranged and repeated.

Referring to FIG. 28, at step 3010, a metal foil is attached to a carrier, the metal foil being pre-made prior to attaching the metal foil. At step 3020, a conductive pillar is formed on a first side of the metal foil distal the carrier. At step 3030, a semiconductor die is attached to the first side of the metal foil. At step 3040, a molding material is formed around the semiconductor die and the conductive pillar. At step 3050, a redistribution structure is formed over the molding material.

Embodiments may achieve advantages. Each of the disclosed embodiments forms an integrated heat sink (e.g., the metal foil, or the metal paste) in the semiconductor device formed. The built-in heat sink of the semiconductor device facilitates heat dissipation of the die 130, thus improving the performance of the die 130 by, e.g., allowing higher integration density of circuits in the die 130, or by allowing the die 130 to run at a higher clock frequency. In addition, the disclosed methods may reduce the manufacturing cost and time by using a pre-formed metal foil instead of forming (e.g., by CVD, PVD) a metal layer during fabrication of the semiconductor device. Additional advantage may include reduced warpage of the semiconductor device.

In an embodiment, a method of forming a semiconductor device includes attaching a metal foil to a carrier, the metal foil being pre-made prior to attaching the metal foil; forming a conductive pillar on a first side of the metal foil distal the carrier; attaching a semiconductor die to the first side of the metal foil; forming a molding material around the semiconductor die and the conductive pillar; and forming a redistribution structure over the molding material. In an embodiment, the method further includes after attaching the semiconductor die and before forming the molding material, performing an etching process, where the etching process reduces a width of the conductive pillar. In an embodiment, the etch process is a wet etch process. In an embodiment, the etch process removes a portion of the metal foil disposed laterally between the conductive pillar and the semiconductor die, and where a remaining portion of the metal foil between the semiconductor die and the carrier has a width that is smaller than a width of the semiconductor die. In an embodiment, attaching the metal foil include attaching the metal foil to the carrier using an adhesive layer, where the method further includes removing the carrier after forming the redistribution structure to expose the adhesive layer. In an embodiment, the method further includes removing the adhesive layer after removing the carrier, where after removing the adhesive layer, an upper surface of the conductive pillar distal the redistribution structure and an upper surface of the molding material distal the redistribution structure are exposed; and bonding a semiconductor package to the upper surface of the conductive pillar. In an embodiment, the method further includes after removing the carrier, forming an opening in the adhesive layer, the opening exposing an upper surface of the conductive pillar distal the redistribution structure; and bonding a semiconductor package to the conductive pillar. In an embodiment, the method further includes forming a dielectric layer over the carrier before attaching the metal foil, the metal foil being attached to the dielectric layer. In an embodiment, attaching the semiconductor die includes attaching the semiconductor die to the first side of the metal foil using a dielectric layer, where the dielectric layer has a thermal conductivity between about 0.2 watts per meter-kelvin (W/(m-k)) to about 10 W/(m-k).

In an embodiment, a method of forming a semiconductor device includes forming a conductive pillar over a first side of a carrier; attaching a backside of a die to the first side of the carrier; forming a molding material around the die and the conductive pillar; forming a redistribution structure over the die, the conductive pillar, and the molding material; removing the carrier, wherein after removing the carrier, a first surface of the conductive pillar distal the redistribution structure is exposed; forming a heat sink over the backside of the die; and bonding a semiconductor package to the first surface of the conductive pillar, the heat sink being between the semiconductor package and the die. In an embodiment, forming the heat sink includes depositing a thermally conductive material over the backside of the die. In an embodiment, the thermally conductive material has a thermal conductivity between about 100 watts per meter-kelvin (W/(m-k)) and about 400 W/(m-k). In an embodiment, forming the heat sink includes forming a metal paste over the backside of the die. In an embodiment, attaching the backside of a die includes attaching the backside of the die to the first side of the carrier using a die attaching film (DAF), where the metal paste is formed over the DAF. In an embodiment, attaching the backside of a die includes attaching the backside of the die to the first side of the carrier using a die attaching film (DAF), where the method further comprises after removing the carrier, removing the DAF to expose the backside of the die, where the metal paste is formed on the backside of the die. In an embodiment, the heat sink contacts a first side of the semiconductor package facing the die.

In an embodiment, a semiconductor device includes a redistribution structure; a die, where a first side of the die is attached to a first side of the redistribution structure; a molding material on the first side of the redistribution structure and around the die; and a heat sink attached to a second side of the die opposing the first side of the die, where a first side of the heat sink distal the redistribution structure is closer to the redistribution structure than a first surface of the molding material distal the redistribution structure. In an embodiment, the heat sink is a metal foil. In an embodiment, the semiconductor device further includes a first dielectric layer attached to the first side of the heat sink, where a first surface of the first dielectric layer distal the heat sink is level with the first surface of the molding material. In an embodiment, a thermal conductivity of the first dielectric layer is between about 1 watts per meter-kelvin (W/(m-k)) and about 10 W/(m-k).

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, the method comprising:
    forming a conductive pillar on a first side of a carrier;
    attaching a pre-formed structure to the first side of the carrier adjacent to the conductive pillar, wherein the pre-formed structure comprises a die, a metal foil attached to a backside of the die, and a dielectric layer attached to a first side of the metal foil facing away from the die;
    forming a molding material on the first side of the carrier around the conductive pillar and around the pre-formed structure;
    forming a redistribution structure over the molding material and electrically coupled to the conductive pillar and the die; and
    after forming the redistribution structure, removing the carrier.

2. The method of claim 1, further comprising, after removing the carrier, attaching a semiconductor package to the conductive pillar through a solder region.

3. The method of claim 1, wherein a second side of the metal foil facing the die is attached to the backside of the die through an adhesive layer.

4. The method of claim 3, wherein the dielectric layer is another adhesive layer, wherein attaching the pre-formed structure comprises attaching the another adhesive layer to the carrier.

5. The method of claim 3, further comprising, before forming the conductive pillar and before attaching the pre-formed structure, forming a release layer on the first side of the carrier, wherein the conductive pillar is formed on the release layer, and the dielectric layer is attached to the release layer.

6. The method of claim 5, wherein removing the carrier removes at least portions of the release layer.

7. The method of claim 6, further comprising, after removing the carrier, performing an etching process to remove residue portions of the release layer.

8. The method of claim 3, further comprising, before forming the molding material, converting exterior portions of the conductive pillar into a metal oxide.

9. The method of claim 8, wherein the converting comprises oxidizing the conductive pillar using an oxidization process.

10. The method of claim 3, wherein after forming the molding material, the conductive pillar, the dielectric layer, and the molding material have a coplanar surface.

11. The method of claim 1, wherein the metal foil is formed of a metal material having a thermal conductivity between about 100 watts per meter-kelvin (W/(m-k)) and about 400 W/(m-k).

12. A method of forming a semiconductor device, the method comprising:
   attaching a first side of a metal foil to a backside of a die;
   after attaching the first side of the metal foil to the backside of the die, attaching a first side of a dielectric layer to a second opposing side of the metal foil;
   after attaching the first side of the dielectric layer to the second opposing side of the metal foil, attaching a second opposing side of the dielectric layer to a carrier;
   forming a molding material over the carrier around the die and around the metal foil;
   forming a redistribution structure over the molding material and the die, wherein the redistribution structure is electrically coupled to die connectors at a front-side of the die; and
   after forming the redistribution structure, removing the carrier.

13. The method of claim 12, wherein the metal foil is pre-formed before being attached to the backside of the die.

14. The method of claim 13, wherein the die is formed on a wafer with a plurality of other dies, wherein attaching the first side of the metal foil comprises attaching the first side of the metal foil to a backside of the wafer, wherein the method further comprises, after attaching the first side of the metal foil and before attaching the second opposing side of the dielectric layer, performing a dicing process to separate the die from the plurality of other dies.

15. The method of claim 14, wherein the first side of the metal foil is attached to the backside of the wafer using a first adhesive layer wherein the dicing process separates the first adhesive layer, the dielectric layer, and the metal foil into separate pieces attached to respective dies.

16. The method of claim 12, further comprising:
   before forming the molding material, forming a conductive pillar on the carrier, wherein the molding material is formed around the conductive pillar; and
   after removing the carrier, bonding a semiconductor package to a first end of the conductive pillar distal from the redistribution structure using solder.

17. A method of forming a semiconductor device, the method comprising:
   forming metal pillars on a carrier;
   attaching a pre-formed structure to the carrier between the metal pillars, wherein the pre-formed structure comprises a die, a metal foil attached to the die, and a first adhesive layer attached to a first side of the metal foil facing away from the die, wherein the pre-formed structure is attached to the carrier by the first adhesive layer, wherein after attaching the pre-formed structure, the metal foil is interposed between the first adhesive layer and the die;
   forming a molding material on the carrier around the metal pillars and around the pre-formed structure;
   forming a redistribution structure over the molding material, wherein the redistribution structure is electrically coupled to the metal pillars and the die; and
   after forming the redistribution structure, removing the carrier.

18. The method of claim 17, further comprising, after forming the redistribution structure and before removing the carrier, forming external connectors over and electrically coupled to the redistribution structure.

19. The method of claim 17, further comprising, before forming the metal pillars, forming a release layer on the carrier, wherein removing the carrier removes at least portions of the release layer.

20. The method of claim 17, after removing the carrier, first end surfaces of the metal pillars are exposed, wherein the method further comprises bonding connectors of a semiconductor package to the first end surfaces of the metal pillars using a solder material.

* * * * *